United States Patent [19]
Kita

[11] Patent Number: 4,948,744
[45] Date of Patent: Aug. 14, 1990

[54] PROCESS OF FABRICATING A MISFET

[75] Inventor: Akio Kita, Tokyo, Japan

[73] Assignee: OKI Electric Industry Co., Ltd., Tokyo, Japan

[21] Appl. No.: 430,972

[22] Filed: Nov. 1, 1989

Related U.S. Application Data

[63] Continuation of Ser. No. 245,339, Sep. 16, 1988, abandoned, which is a continuation of Ser. No. 62,427, Jun. 16, 1987, abandoned.

[30] Foreign Application Priority Data

Jun. 30, 1986 [JP] Japan ................................ 61-151686

[51] Int. Cl.$^5$ ......................................... H01L 21/265
[52] U.S. Cl. ........................................ 437/44; 437/41; 437/240; 148/DIG. 106; 148/DIG. 118; 357/23.3
[58] Field of Search ...................... 437/40, 41, 44, 150, 437/153, 154, 157, 160, 164, 240; 148/DIG. 103, DIG. 106, DIG. 118; 357/23.3, 23.9

[56] References Cited

U.S. PATENT DOCUMENTS

| | | | |
|---|---|---|---|
| 4,597,824 | 7/1986 | Shinada et al. | 156/643 |
| 4,637,124 | 1/1987 | Okuyama et al. | 437/151 |
| 4,755,479 | 7/1988 | Miura | 437/44 |

FOREIGN PATENT DOCUMENTS 280668 12/1986 Japan .

OTHER PUBLICATIONS

Tsang et al., "Fabrication of High-Performance LDDFET's With Oxide Sidewall-Spacer Technology", IEEE Journal of Solid-State Circuits, Vol. SC-17, No. 2, Apr. 1982, pp. 220-226.
Wolf et al., Silicon Processing for the VLSI Era, vol. 1, Process Technology, Calif., Lattice Press, 1986, pp. 185-191.

Primary Examiner—Brian E. Hearn
Assistant Examiner—M. Wilczewski
Attorney, Agent, or Firm—Spencer & Frank

[57] ABSTRACT

In a process of fabricating a MISFET of the LDD structure, a gate insulation film is formed on a semiconductor substrate or a semiconductor thin film. A gate electrode is formed on the gate insulation film, and lightly-doped regions are formed in the semiconductor substrate or the semiconductor thin film by ion implantation using the gate electrode as a mask. Next, a CVD oxide film containing an impurity is unselectively deposited, sidewalls are formed along the edges of the gate electrodes by anisotropic etching, and heavily-doped source and drain regions are formed in the semiconductor substrate or the semiconductor thin film by ion implanation using the gate electrode and the sidewalls as a mask.

13 Claims, 4 Drawing Sheets

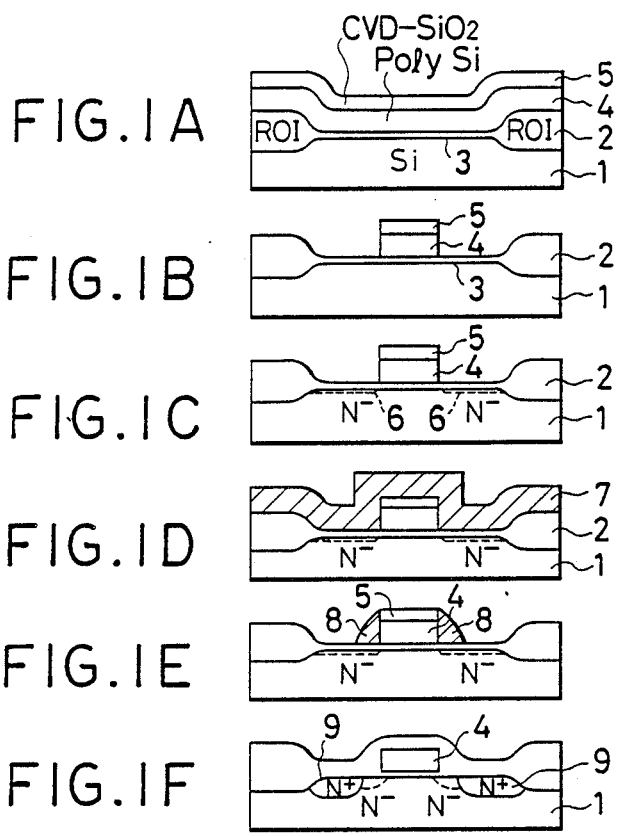
FIG.1A
FIG.1B
FIG.1C
FIG.1D
FIG.1E
FIG.1F
FIG.2
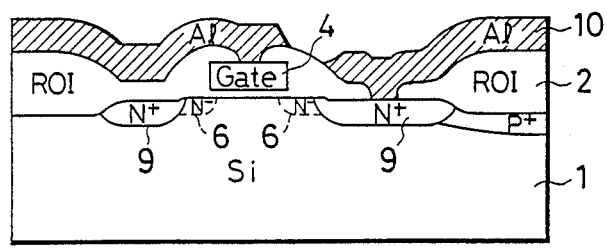

PROCESS OF FABRICATING A MISFET

This application is a continuation, of application Ser. No. 07/245,339, filed Sept. 16, 1988, abandoned, which is a continuation of Ser. No. 07/062,427 filed June 16th, 1987, abandoned.

BACKGROUND OF THE INVENTION

The present invention relates to a process of fabricating a miniature MISFET (metal-insulator-semiconductor field effect transistor) of a minute construction.

Miniaturization of MISFETs has been achieved by the law of scaling. According to this law, if the applied voltage and the physical dimensions are reduced to 1/K and the impurity concentration is increased to K times, the electric field configuration is unchanged, and the switching time and the current consumption are reduced to $1/K^2$. However in practice it is rare that the power supply voltage is reduced in proportion with the physical dimensions. This is because of the desirability of facilitating an interface with external circuits and providing adequate noise margins. As a result, the electric field in the MISFET is increased, and, because of the hot-carrier injection effect, the threshold voltage may be varied and the mutual conductance is lowered, so that the reliability of the device is degraded.

Various proposals have been made to alleviate the hot carrier injection effect. An example is the use of an LDD (lightly-doped drain) structure, as is disclosed in the IEEE Transactions on Electron Devices, Vol. ED-29, No. 4, April 1982, pp. 590–596, "Fabrication of High-Performance LDDFET's with Oxide Sidewall-Spacer Technology", Tsang, et al. This LDDFET is described with reference to FIGS. 1A to 1F.

As illustrated in FIG. 1A, a silicon substrate 1 is prepared, on which a field oxide film 2, a gate oxide film 3, a polycrystalline silicon (poly-Si) film 4, and a $CVDSiO_2$ film 5 formed by chemical vapor deposition) are formed in turn.

Next, as illustrated in FIG. 1B, the $CVDSiO_2$ film 5 and the poly-Si film 4 are patterned. The patterned poly-Si film 4 constitutes a gate electrode.

Next, as illustrated in FIG. 1C, ion-implantation is performed using the patterned films 5 and 4 as a mask (i.e., by self-alignment) to form N− regions (lightly-doped regions) 6 in the silicon substrate 1.

Next, as illustrated in FIG. 1D, a $CVDSiO_2$ film 7 is deposited over the entire surface.

Next, as illustrated in FIG. 1E, RIE (reactive ion etching) is performed to form sidewalls 8.

Next, as illustrated in FIG. 1F, ion implantation is performed using the patterned films 5 and 4, and the sidewalls 8 as a mask (i.e., by self alignment) to form N+ regions (heavily doped regions) 9.

Subsequently, an interlayer insulating film is deposited, and a contact is opened and an Al (aluminum) conductor layer 10 is formed to obtain an LDDFET as shown in FIG. 2.

In this way, the lightly-doped regions are formed under the sidewalls 8 to alleviate the electric field intensity.

The hot carrier injection effect of the MISFET of the above-described MISFET depends largely on the shape of the sidewalls 8 (FIG. 1E). Accordingly, the process of forming the sidewalls is critical. But it has been difficult to form sidewalls of a desirable shape.

SUMMARY OF THE INVENTION

An object of the invention is to provide a process of fabricating a MISFET of a LDD structure by which sidewalls of a desirable shape can be formed.

According to the invention, there is provided a process of fabricating a MISFET of a LDD structure comprising the steps of:

(a) providing a semiconductor substrate or a semiconductor thin film, (b) forming a gate insulation film on the semiconductor substrate or the semiconductor thin film, (c) forming a gate electrode on the gate insulation film, (d) forming lightly-doped regions in the semiconductor substrate or the semiconductor thin film by ion implantation using the gate electrode as a mask, (e) unselectively depositing a CVD oxide film containing an impurity, (f) forming sidewalls along the edges of the gate electrodes by anisotropic etching, (g) forming heavily-doped source and drain regions in the semiconductor substrate or the semiconductor thin film by ion implantation using the gate electrode and the sidewalls as a mask.

By controlling the impurity concentration in the CVD oxide film, with the process as described above, when the sidewalls are formed, the coverage ratio of the oxide film at the edge of the gate electrode can be reduced. The coverage ratio is defined as the ratio of the minimum thickness Tsmin of the CVD oxide film on the side of the gate electrode to the thickness Tt of the CVD oxide film on the top surface of the gate electrode.

The impurity doped CVD oxide film is formed by atmospheric-pressure CVD, so that it has an overhang at the edge of the gate electrode. By a subsequent anisotropic etching, sidewalls having an ideal shape can be obtained. The reproducibility is very good and fluctuations in the resultant characteristic is small. Moreover, since the CVD oxide film is doped with an impurity, the etching rate is higher. As a result, reduction in the thickness of the field oxide film at the time of etching for forming sidewalls can be reduced.

BRIEF DESCRIPTION OF THE DRAWINGS

In the accompanying drawings:

FIGS. 1A to 1F are cross sectional views showing various steps of a prior art production of an LDD MISFET;

FIG. 2 is a cross sectional view showing the structure of an LDD MISFET produced by the prior art process;

DESCRIPTION OF THE PREFERRED EMBODIMENT

An embodiment of the invention is described with reference to FIGS. 3A to 3D, which show cross sections at various steps of the fabrication. In this embodiment, a P-type semiconductor substrate is used to form an N-channel MISFET.

Figure 3A:
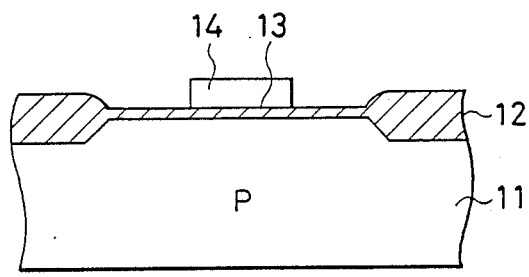
FIGS. 3A to 3D are cross sectional views showing various steps of production according to the invention.

First a P-type silicon substrate 11 is prepared. A field oxide film 12 is then formed on the silicon substrate 11 to isolate the individual MISFETs by selective oxidation. A gate insulation film 13 is grown to a thickness of 20 nm by thermal oxidation. Polysilicon 14 is deposited by CVD to a thickness of 300 nm. The polysilicon layer 14 is then patterned by photolithography. This etching should be so controlled that the gate oxide film under the polysilicon layer 14 is not removed. In this way, a structure as shown in FIG. 3A is obtained. The polysilicon layer 14 is subsequently used as a gate electrode, as will be described later.

Next, lightly-doped N-type regions 15 are formed by ion-implantation of phosphorus (P) using the gate electrode 14 as a mask. The lightly-doped regions 15 serve to alleviate the electric field. When the dose of phosphorus is $3 \times 10^{13}$ cm$^{-2}$ and the energy is 50 KeV, the concentration of the impurity at the surface is about $3 \times 10^{18}$ cm$^{-3}$.

An oxide film 16 is deposited unselectively, e.g, throughout the entire surface, by means of CVD. The oxide film is used to form sidewalls as described later. The covering shape or profile of the oxide film at the edge of the gate electrode largely affects the shape of the sidewalls. The covering shape is therefore very important. According to the invention, the oxide film is formed to have an overhang projecting in the direction parallel to the surface of the semiconductor substrate. This can be implemented by growing the oxide film by atmospheric-pressure CVD using monosilane (SiH$_4$) gas and oxygen. Phosphorus (P), boron (B) or arsenic (As) was used as an impurity. For introduction of phosphorus (P), phosphine (PH$_3$) can be used. For introduction of boron (B), diborane (B$_2$H$_6$) can be used. For introduction of arsenic (As). arsine (AsH$_3$) can be used.

A suitable range of concentration of phosphorus is about 2 to 10 mol % in terms of the amount of P$_2$O$_5$. A suitable range of concentration of boron is about 3 to 10 mol % in terms of the amount of B$_2$O$_3$. Below the lower limits, the coverage angle is not large enough, i.e., the ideal shape of the covering film is not obtained. Above the upper limits, the impurity precipitates to deteriorate the property of the CVD oxide film.

Figure 4:
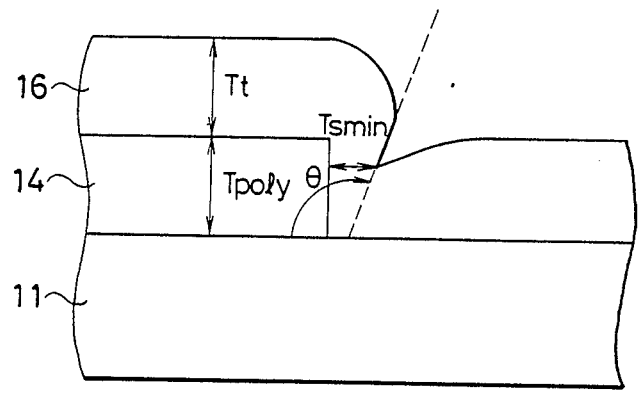
FIG. 4 is a cross sectional view explaining the definition of the covering angle.

FIG. 4 provides a definition of the covering angle at the edge of the impurity-containing oxide film. As illustrated, it is the angle between a tangential plane at the edge of the oxide film surface and the principal surface of the wafer. The larger the covering angle is, the larger is the overhang.

Figure 5:
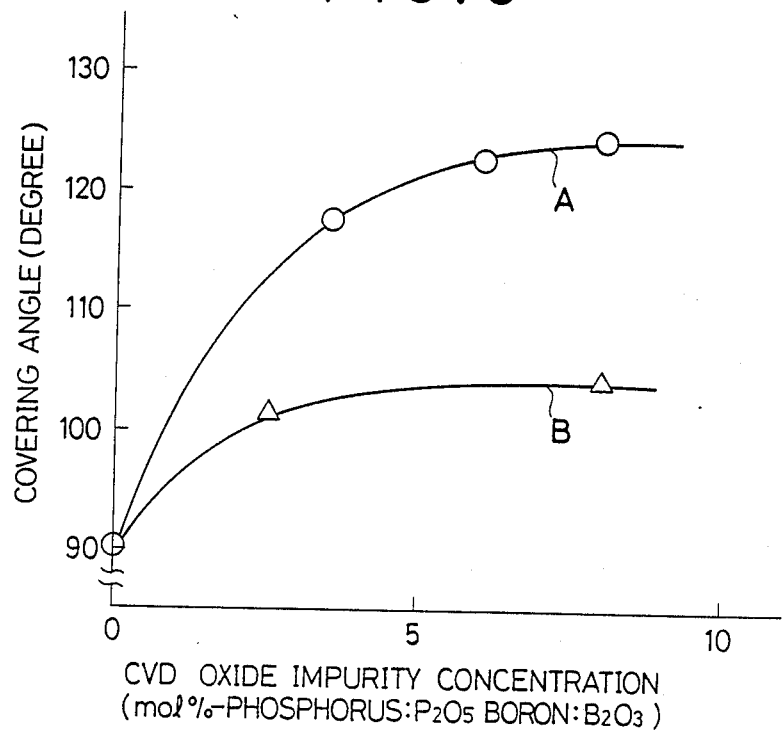
FIG. 5 is a diagram showing the relationship between the covering angle and the impurity concentration.

FIG. 5 shows the relationship between the impurity concentration and the covering angle. The curve A shows the covering angle when the oxide film is doped with phosphorus. The curve B shows the covering angle when the oxide film is doped with boron. The curves show that the higher impurity concentration leads to larger covering angle. This effect is particularly significant when phosphorus is used as an impurity.

Figure 3B:
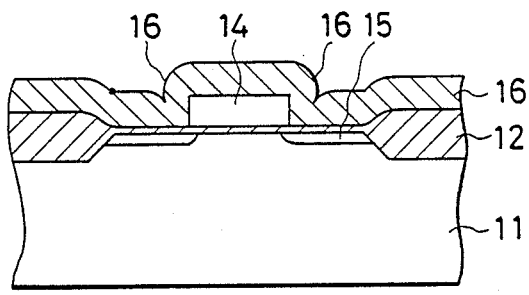

In the illustrated embodiment, the thickness Tpoly of the polysilicon film used for the formation of the gate electrode is 300 nm, the oxide film is doped with phosphorus, and the concentration is 4 mol % in terms of the contents of P$_2$O$_5$. The impurity in the oxide film does not diffuse into the substrate because of the intervening gate oxide film (FIG. 3B).

Next, anisotropic etching is performed by means of an anisotropic plasma etcher of a parallel-plane anode-couple type to leave sidewalls 16' on the sides of the gate electrodes. The gas used was C$_2$F$_6$ and CHF$_3$, and the RF power was 1 W/cm$^2$. When the oxide film has an overhang at each edge of the gate electrode, the oxide film itself serves as an etching mask. The resultant sidewalls 16' have steep rising edges, so that they form an ideal mask during ion-implantation for forming the heavily-doped N+ regions 17, which will be later described.

Figure 6:
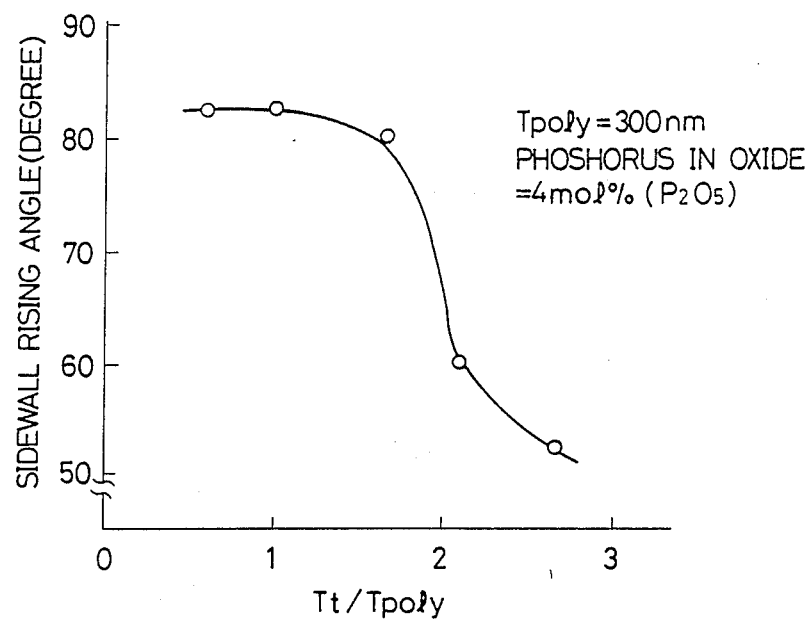
FIG. 6 is a diagram showing the relationship between the sidewall rising angle and the ratio of the sidewall oxide film thickness to the gate polysilicon film thickness.
Figure 7:
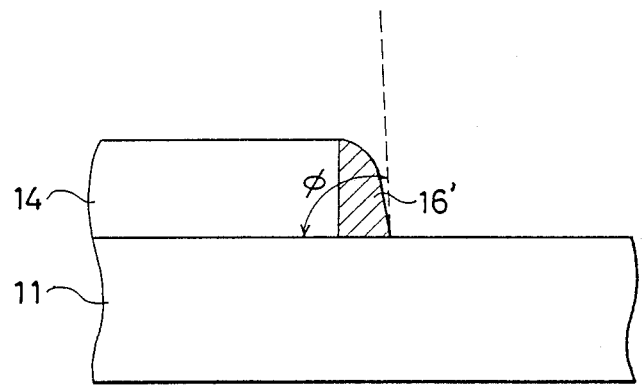
FIG. 7 is a cross sectional view explaining the definition of the sidewall rising angle.

FIG. 6 shows the relationship between the sidewall rising angle $\phi$ and the ratio of the sidewall oxide film thickness Tt to the gate polysilicon film thickness Tpoly. The sidewall rising angle $\phi$ is defined as an angle $\phi$ between a plane tangential to the surface of the sidewall at the verge of rising and the surface of the substrate, as show in FIG. 7. As will be seen, when the ratio exceeds about 1.6, the rising angle drops sharply. The minimum ratio is determined by the minimum sidewall oxide film thickness which is determined by the minimum length of the lightly-diffused region and by the maximum thickness of the gate electrode which can be accepted for consideration of other factors.

Moreover, the impurity-doped CVD oxide film has a greater etching rate, so that the ratio of the etching rate of the impurity-doped CVD oxide to the etching rate of the thermally-formed oxide film is greater. Some over-etching can therefore be made without reducing the thickness of the field oxide film.

Figure 3C:
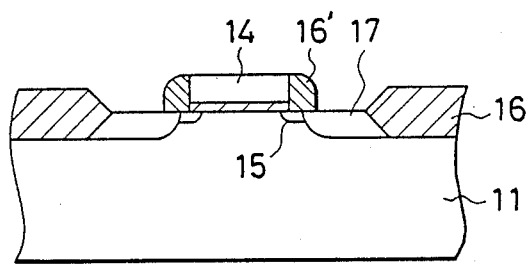

After the formation of the sidewalls 16', heavily doped N+ regions 17 are formed by ion-implantation of arsenic (As) using the gate electrode and the sidewalls 16' as a mask (FIG. 3C). The dose of arsenic is $5 \times 10^{15}$ cm$^{-2}$, for example.

Figure 3D:
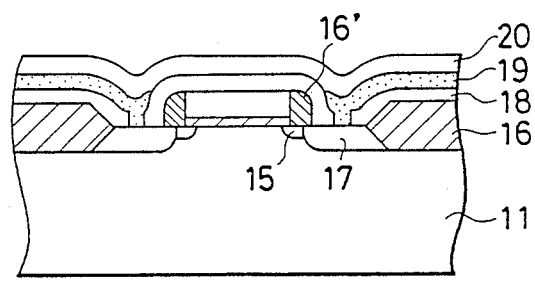

Subsequently, known methods were used to form an insulating film 18, to open a contact hole, to form a metal conductor 19 and a protective layer 20 (FIG. 3D).

In the embodiment described, a gate insulating film is formed on a semiconductor substrate. The invention is also applicable where a gate insulation film is formed on a semiconductor thin film.

The invention which has been described has the following advantages.

(1) An impurity-doped CVD oxide film is formed by atmospheric-pressure CVD, so that it has an overhang at the edge of the gate electrode. By a subsequent anisotropic etching, sidewalls having an ideal shape can be obtained. The reproducibility is very good and the fluctuation in the resultant characteristic is small.

(2) Since the CVD oxide film is doped with an impurity, the etching rate is higher. As a result, reduction in thickness of the field oxide film at the time of etching for forming sidewalls can be reduced.

The invention is not limited to the embodiments described above, but various modifications can be made without departing from the spirit and scope of the invention.

What is claimed is:

1. A process of fabricating a MISFET of the LDD structure comprising the steps of:

(a) providing a semiconductor substrate or a semiconductor thin film, said semiconductor substrate or thin film having a surface;

(b) forming a gate insulation film on the surface of said semiconductor substrate or semiconductor thin film;

(c) forming a gate electrode on the gate insulation film;

(d) forming lightly-doped regions in the semiconductor substrate or the semiconductor thin film by ion implantation using the gate electrode as a mask;

(e) depositing a CVD oxide film, having a thickness $T_t$ which is less than 1.6 times the thickness $T_{poly}$ of said gate electrode, over said gate insulation film and gate electrode, said CVD oxide film containing an impurity selected from the group consisting of phosphorus and boron, wherein the amount of said impurity is in the range 2 to 10 mol % for phosphorus when calculated in terms of the amount of $P_2O_5$ and 3 to 10 mol % for boron when calculated in terms of the amount of $B_2O_3$, whereby said CVD oxide film has an overhang at each edge of said gate electrode and a covering angle greater than 90°, said covering angle being defined as the angle between a plane tangential to the edge of said CVD oxide film and the surface of said semiconductor substrate;

(f) performing anisotropic etching on said CVD oxide film with the projection over said gate electrode in a direction substantially parallel to the surface of said semiconductor substrate or thin film to form sidewalls having a surface along the edges of said gate electrode with a rising angle greater than 80°, said rising angle being defined as the angle between a plane tangential to the surface of said sidewall adjacent the surface of said semiconductor substrate and the surface of said semiconductor substrate; and (g) forming heavily-doped source and drain regions in the semiconductor substrate or the semiconductor thin film by ion implantation using the gate electrode and the sidewalls as a mask.

2. A process according to claim 1, wherein the steps (a) to (g) are carried out in the stated order.

3. A process according to claim 1, wherein step (e) comprises growing said CVD oxide film at about atmospheric pressure.

4. A process according to claim 3, wherein step (e) comprises growing said CVD oxide film using monosilane ($SiH_4$) gas and oxygen.

5. A process of fabricating a MISFET of the LDD structure comprising the steps of:

(a) providing a semiconductor substrate or a semiconductor thin film, said semiconductor substrate or thin film having a surface;

(b) forming a gate insulation film on the surface of said semiconductor substrate or semiconductor thin film;

(c) forming a gate electrode on the gate insulation film;

(d) forming lightly-doped regions in the semiconductor substrate or the semiconductor thin film by ion implantation using the gate electrode as a mask;

(e) depositing a CVD oxide film, having a thickness which is less than 1.6 times the thickness of said gate electrode, over said gate insulation film and gate electrode, said CVD oxide film containing an impurity selected from the group consisting of phosphorus and boron, wherein the amount of said impurity is in the range 2 to 10 mol % for phosphorus when calculated in terms of the amount of $P_2O_5$ and 3 to 10 mol % for boron when calculated in terms of the amount of $B_2O_3$, whereby said CVD oxide film has an overhang at each edge of said gate electrode and a covering angle greater than 90°, said covering angle being defined as the angle between a plane tangential to the edge of said CVD oxide film and the surface of said semiconductor substrate;

(f) performing anisotropic etching on said CVD oxide film to form sidewalls having a surface along the edges of said gate electrode, with no intervening heat treatment for reflow of said CVD oxide film between the deposition of said CVD oxide film at step (e) and said etching with a rising angle greater than 80°, said rising angle being defined as the angle between a plane tangential to the surface of said sidewall adjacent the surface of said semiconductor substrate and the surface of said semiconductor substrate; and (g) forming heavily-doped source and drain regions in the semiconductor substrate or the semiconductor thin film by ion implantation using the gate electrode and the sidewalls as a mask.

6. A process according to claim 5, wherein step (e) comprises growing said CVD oxide film at about atmospheric pressure.

7. A process according to claim 6, wherein step (e) comprises growing said CVD oxide film using monosilane ($SiH_4$) gas and oxygen.

8. A process of fabricating a MISFET of the LDD structure comprising the steps of:

(a) providing a semiconductor substrate or a semiconductor thin film, with a gate insulation film thereon, and a gate electrode on the gate insulation film;

(b) forming lightly-doped regions in the semiconductor substrate or the semiconductor thin film by ion implantation using the gate electrode as a mask;

(c) depositing a CVD oxide film, having a thickness which is less than 1.6 times the thickness of said gate electrode, over said gate insulation film and gate electrode, said CVD oxide film containing an impurity selected from the group consisting of phosphorus and boron, wherein the amount of said impurity is in the range 2 to 10 mol % for phosphorus when calculated in terms of the amount of $P_2O_5$ and 3 to 10 mol % for boron when calculated in terms of the amount of $B_2O_3$, whereby said CVD oxide film has an overhang at each edge of said gate electrode and a covering angle greater than 90°, said covering angle being defined as the angle between a plane tangential to the angle of said CVD oxide film and the surface of said semiconductor substrate;

(d) performing anisotropic etching on said CVD oxide film with the projection over said gate electrode in a direction substantially parallel to the surface of said semiconductor substrate or thin film to form sidewalls having a surface along the edges of said gate electrode with a rising angle greater than 80°, said rising angle being defined as the angle between a plane tangential to the surface of said sidewall adjacent the surface of said semiconductor substrate and the surface of said semiconductor substrate; and (e) forming heavily-doped source and drain regions in the semiconductor substrate or the semiconductor thin film by ion implantation using the gate electrode and the sidewalls as a mask.

9. A process according to claim 8, wherein step (c) comprises growing said CVD oxide film at about atmospheric pressure.

10. A process according to claim 9, wherein step (c) comprises growing said CVD oxide film using monosilane ($SiH_4$) gas and oxygen.

11. A process of fabricating a MISFET of the LDD structure comprising the steps of:

(a) providing a semiconductor substrate or a semiconductor thin film, with a gate insulation film thereon, and a gate electrode on the gate insulation film;

(b) forming lightly-doped regions in the semiconductor substrate or the semiconductor thin film by ion implantation using the gate electrode as a mask;

(c) depositing a CVD oxide film, having a thickness which is less than 1.6 times the thickness of said gate electrode, over said gate insulation film and gate electrode, said CVD oxide film containing an impurity selected from the group consisting of phosphorus and boron, wherein the amount of said impurity is in the range 2 to 10 mol % for phosphorus when calculated in terms of the amount of $P_2O_5$ and 3 to 10 mol % for boron when calculated in terms of the amount of $B_2O_3$, whereby said CVD oxide film has an overhang at each edge of said gate electrode and a covering angle greater than 90°, said covering angle being defined as the angle between a plane tangential to the edge of said CVD oxide film and the surface of said semiconductor substrate;

(d) performing anisotropic etching on said CVD oxide film to form sidewalls along the edges of said gate electrode, with no intervening heat treatment for reflow of said CVD oxide film between the deposition of said CVD oxide film at step (e) and the last-mentioned etching with a rising angle greater than 80°, said rising angle being defined as the angle between a plane tangential to the surface of said sidewall adjacent the surface of said semiconductor substrate and the surface of said semiconductor substrate; and (e) forming heavily-doped source and drain regions in the semiconductor substrate or the semiconductor thin film by ion implantation using the gate electrode and the sidewalls as a mask.

12. A process according to claim 11, wherein step (c) comprises growing said CVD oxide film at about atmospheric pressure.

13. A process according to claim 12, wherein step (c) comprises growing said CVD oxide film using monosilane ($SiH_4$) gas and oxygen.

* * * * *